(12) United States Patent
Kim

(10) Patent No.: US 10,476,213 B2
(45) Date of Patent: Nov. 12, 2019

(54) CONNECTION CABLE AND ANTENNA CONNECTION DIAGNOSIS DEVICE

(71) Applicants: Hyundai Motor Company, Seoul (KR); Kia Motors Corporation, Seoul (KR)

(72) Inventor: Byungguk Kim, Hwaseong-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 73 days.

(21) Appl. No.: 15/830,488

(22) Filed: Dec. 4, 2017

(65) Prior Publication Data

US 2019/0089100 A1    Mar. 21, 2019

(30) Foreign Application Priority Data

Sep. 20, 2017    (KR) .................. 10-2017-0121009

(51) Int. Cl.
| | | |
|---|---|---|
| *H01R 13/66* | (2006.01) | |
| *H01Q 1/12* | (2006.01) | |
| *G01R 31/04* | (2006.01) | |
| *H01Q 1/32* | (2006.01) | |
| *G01R 31/00* | (2006.01) | |
| *H01Q 9/30* | (2006.01) | |

(52) U.S. Cl.
CPC ....... *H01R 13/6683* (2013.01); *G01R 31/006* (2013.01); *G01R 31/041* (2013.01); *H01Q 1/1214* (2013.01); *H01Q 1/3275* (2013.01); *H01R 13/6616* (2013.01); *H01Q 9/30* (2013.01)

(58) Field of Classification Search
CPC ............ H01R 13/6683; H01R 13/6616; G01R 31/006; G01R 31/041; H01Q 1/3275; H01Q 1/1214
USPC .......................... 324/500, 503, 504, 505, 507
See application file for complete search history.

(56) References Cited

U.S. PATENT DOCUMENTS

| | | | | |
|---|---|---|---|---|
| 3,858,159 A | * | 12/1974 | Worth .................. | H01R 12/675 439/399 |
| 6,392,317 B1 | * | 5/2002 | Hall ...................... | E21B 17/003 174/47 |
| 2002/0047714 A1 | * | 4/2002 | Murata .............. | G01R 31/2829 324/547 |
| 2006/0178047 A1 | * | 8/2006 | Croan ................ | H01R 13/6272 439/578 |
| 2010/0244847 A1 | * | 9/2010 | Kudo .................... | B60L 3/0046 324/433 |

(Continued)

FOREIGN PATENT DOCUMENTS

KR             101102606 B1     1/2012

*Primary Examiner* — Giovanni Astacio-Oquendo
(74) *Attorney, Agent, or Firm* — Slater Matsil, LLP

(57) ABSTRACT

Disclosed herein are a connection cable, an antenna connection diagnosis device, a vehicle including the same, and an antenna connection diagnosis method. The antenna connection diagnosis device includes a first cable having a first connector installed at one end thereof and a first connection diagnosis connector installed at the other end. A second cable has a second connector, which is capable of being coupled to the first connection diagnosis connector, formed at one end thereof. A diagnoser is configured to diagnose whether the first cable and the second cable are connected using the first connection diagnosis connector.

20 Claims, 11 Drawing Sheets

(56) References Cited

U.S. PATENT DOCUMENTS

2013/0099740 A1\* 4/2013 Takashima .......... B60L 11/1816
320/109
2013/0106430 A1\* 5/2013 Izawa ................ G01R 31/3835
324/434

\* cited by examiner

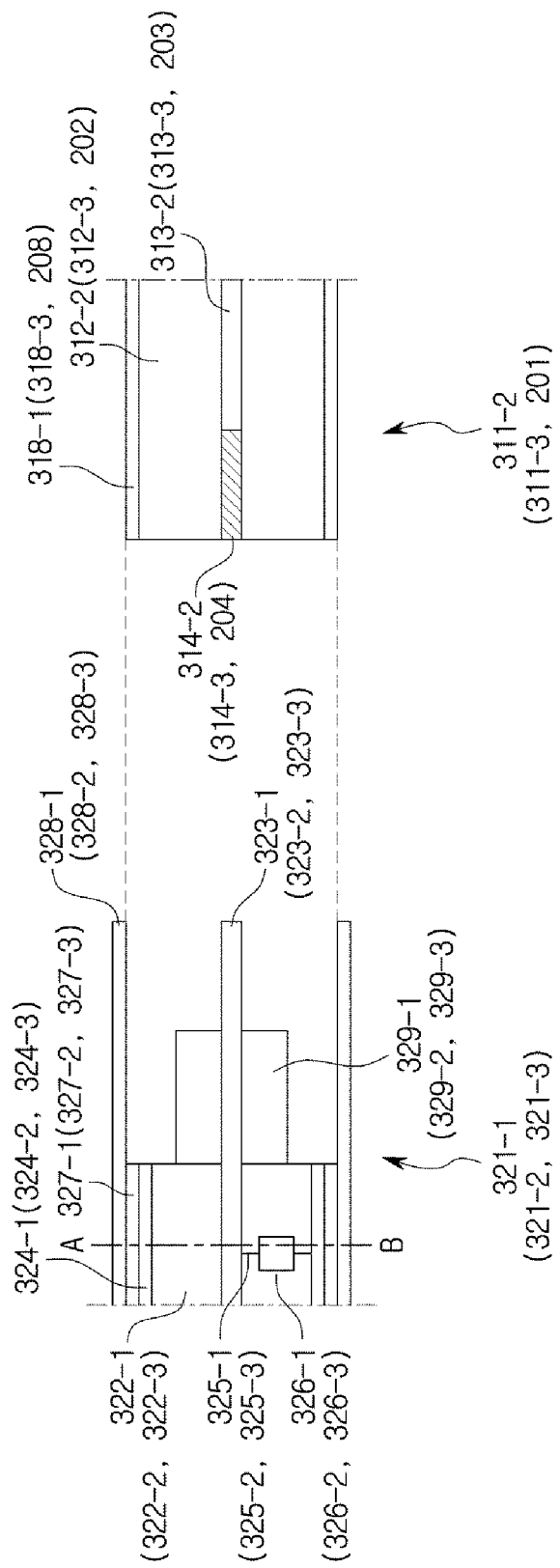

CONNECTION CABLE AND ANTENNA CONNECTION DIAGNOSIS DEVICE

CROSS-REFERENCE TO RELATED APPLICATIONS

This application claims priority to Korean Patent Application No. 10-2017-0121009, filed in the Korean Intellectual Property Office on Sep. 20, 2017, which application is hereby incorporated herein by reference.

TECHNICAL FIELD

Embodiments of the present disclosure relate to a connection cable, an antenna connection diagnosis device, a vehicle including the same, and an antenna connection diagnosis method.

BACKGROUND

Generally, a vehicle refers to an apparatus that is movable by rotation of one or more vehicle wheels installed in a body of the vehicle. Generally, examples of such a vehicle include a three-wheel or four-wheel vehicle, a two-wheel vehicle such as a motorcycle, construction equipment, a bicycle, a train running on a rail disposed on a track, and the like. In the context of this document, vehicle includes a driverless vehicle or a flying vehicle (e.g., a drone).

For convenience and enjoyment of a user (including a driver and/or a passenger), devices that receive an external signal and provide the user with the received information without change or after processing the received information are installed in a vehicle. For example, one or more devices such as a navigation device, a vehicle television system, a car audio system, and/or a radio device capable of visually and/or acoustically providing information are installed in a vehicle.

A signal required for operations of such devices may be received via an antenna. An antenna is a device provided to receive an electromagnetic wave from a peripheral space and/or transmit a predetermined electromagnetic wave to the space. Specifically, an antenna may acquire an electrical signal corresponding to an electromagnetic wave in a space. The acquired electrical signal is transmitted to the above-mentioned devices via a cable or a wireless network such as a controller area network (CAN).

SUMMARY

Embodiments of the present disclosure provide a connection cable, an antenna connection diagnosis device, a vehicle including the same, and an antenna connection diagnosis method capable of simultaneously diagnosing connection states of a plurality of cables and determining non-connected cables among the plurality of cables.

Additional aspects of the disclosure will be set forth in part in the description which follows and, in part, will be obvious from the description, or may be learned by practice of the disclosure.

In accordance with one aspect of the present disclosure, an antenna connection diagnosis device includes a first cable having a first connector installed at one end thereof and a first connection diagnosis connector installed at the other end. A second cable has a second connector, which is capable of being coupled to the first connection diagnosis connector, formed at one end thereof. A diagnoser is configured to diagnose whether the first cable and the second cable are connected using the first connection diagnosis connector.

The first connection diagnosis connector may include a first signal line to which an electrical signal is transmitted, a first ground spaced apart from the first signal line, and a first resistor formed between the first signal line and the first ground.

The first resistor may include a carbon film or a metal film.

The second cable may have a second connection diagnosis connector installed at the other end, and the second connection diagnosis connector may include a second signal line to which the electrical signal is transmitted, a second ground spaced apart from the second signal line, and a second resistor, which is different from the first resistor, formed between the second signal line and the second ground.

The diagnoser may include a first diagnoser signal line to which an electrical signal transmitted from the first cable and the second cable is transmitted, a voltage applier connected to a second diagnoser signal line branched from the first diagnoser signal line, and configured to apply a control voltage to a third diagnoser signal line, a voltage measurer installed in the third diagnoser signal line, which is branched from the second diagnoser signal line, and configured to measure a voltage of the third diagnoser signal line in response to the application of the control voltage, and a determiner configured to determine whether the first cable and the second cable are not connected on the basis of the measured voltage.

The antenna connection diagnosis device may further include a third cable having a third connector which is capable of being coupled to the second connection diagnosis connector.

The determiner may determine that the second cable and the third cable are not connected when a voltage equal to the control voltage is measured by the voltage measurer or determine that the first cable and the second cable are not connected when a voltage corresponding to the second resistor is measured by the voltage measurer.

The antenna connection diagnosis device may further include an antenna including a connection diagnosis antenna connector capable of being coupled to the first connector.

The determiner may determine that the antenna and the first cable are not connected to each other when a voltage corresponding to the first resistor and the second resistor is measured by the voltage measurer.

The connection diagnosis antenna connector may include an antenna signal line to which the electrical signal is transmitted, an antenna ground spaced apart from the antenna signal line, and an antenna resistor, which is different from the first resistor and the second resistor, formed between the antenna signal line and the antenna ground, and the determiner may determine that the antenna, the first cable, and the second cable are connected to each other when a voltage corresponding to the first resistor or a third resistor is measured by the voltage measurer.

At least one of the first resistor and the second resistor may have a resistance value that is predetermined to prevent deterioration of frequency performance.

An antenna connection diagnosis method includes applying a control voltage to a second diagnoser signal line branched from a first diagnoser signal line, wherein the first diagnoser signal line is electrically connected to a first cable having a first connector installed at one end thereof and a first connection diagnosis connector installed at the other end and a second cable having a second connector, which is coupled to the first connection diagnosis connector, formed at one end thereof, measuring a voltage of a third diagnoser signal line branched from the second diagnoser signal line in response to the application of the control voltage, and determining whether the first cable and the second cable are not connected on the basis of the measured voltage.

The first connection diagnosis connector may include a first signal line to which an electrical signal is transmitted, a first ground spaced apart from the first signal line, and a first resistor formed between the first signal line and the first ground.

The second cable may have a second connection diagnosis connector installed at the other end, and the second connection diagnosis connector may include a second signal line to which the electrical signal is transmitted, a second ground spaced apart from the second signal line, and a second resistor, which is different from the first resistor, formed between the second signal line and the second ground.

The second connection diagnosis connector may be capable of being coupled to a third connector of a third cable.

The determining of whether the first cable and the second cable are not connected on the basis of the measured voltage may include at least one of determining that the second cable and the third cable are not connected when a voltage equal to the control voltage is measured and determining that the first cable and the second cable are not connected when a voltage corresponding to the second resistor is measured.

The first connector may be capable of being connected to a connection diagnosis antenna connector of an antenna.

The determining of whether the first cable and the second cable are not connected on the basis of the measured voltage may include determining that the antenna and the first cable are not connected to each other when a voltage corresponding to the first resistor and the second resistor is measured.

The connection diagnosis antenna connector may include an antenna signal line to which the electrical signal is transmitted, an antenna ground spaced apart from the antenna signal line, and an antenna resistor, which is different from the first resistor and the second resistor, formed between the antenna signal line and the antenna ground, and the determining whether the first cable and the second cable are not connected on the basis of the measured voltage may include determining that the antenna, the first cable, and the second cable are connected to each other when a voltage corresponding to the first resistor or a third resistor is measured by the voltage measurer.

An antenna connection cable includes a first cable having a first connection diagnosis connector installed at one end thereof, and a second cable having a first connector, which is capable of being coupled to the first connection diagnosis connector, formed at one end thereof and a second connection diagnosis connector installed at the other end, wherein the first connection diagnosis connector includes a first signal line to which an electrical signal is transmitted, a first ground spaced apart from the first signal line, and a first resistor formed between the first signal line and the first ground, and the second connection diagnosis connector may include a second signal line to which the electrical signal is transmitted, a second ground spaced apart from the second signal line, and a second resistor, which is different from the first resistor, formed between the second signal line and the second ground.

A vehicle includes an antenna having a connection diagnosis antenna connector, a first cable having a first connector, which is capable of being coupled to the connection diagnosis antenna connector, installed at one end thereof and a first connection diagnosis connector installed at the other end, a second cable having a second connector, which is capable of being coupled to the first connection diagnosis connector, formed at one end thereof, and a diagnoser configured to diagnose whether the first cable and the second cable are connected using the first connection diagnosis connector.

BRIEF DESCRIPTION OF THE DRAWINGS

These and/or other aspects of the disclosure will become apparent and more readily appreciated from the following description of the embodiments, taken in conjunction with the accompanying drawings of which:

FIG. 5A is a first cross-sectional view of the connection diagnosis antenna connector and the connection diagnosis connector according to an embodiment;

DETAILED DESCRIPTION OF ILLUSTRATIVE EMBODIMENTS

Figure 1:
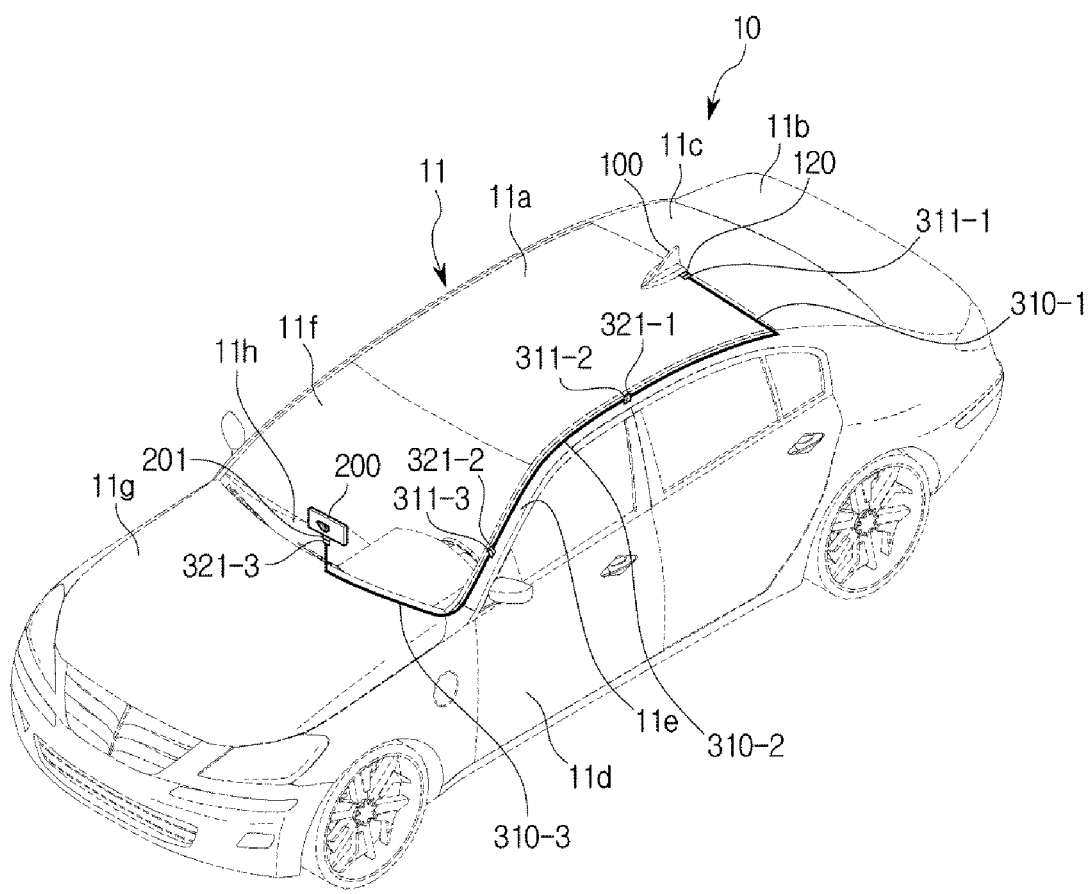
FIG. 1 is a view illustrating an example of an antenna and a cable installed in a vehicle.

Hereinafter, like elements are denoted by like reference numerals throughout the specification unless described otherwise. Terms used below to which the suffix "-er" or "-or" is added may be implemented with software or hardware. According to an embodiment, the terms to which the suffix "-er" or "-or" is added may be implemented with a single component or may be implemented with a plurality of components.

Throughout the specification, when a certain part is described as being "connected" to another part, this may signify that the certain part is physically connected to the other part or that the certain part is electrically connected to the other part depending on the certain part and the other part.

When a certain part is described as "including" another part, this signifies that the certain part may also include other elements according to a designer's choice rather than excluding other elements unless particularly described otherwise.

Terms such as "first" and "second" are used to distinguish one element from another element and do not imply a sequential order unless particularly described otherwise.

A singular expression includes a plural expression unless context clearly indicates otherwise.

Hereinafter, a connection cable, an antenna connection diagnosis device including the connection cable, and a vehicle to which the antenna connection diagnosis device is applied according to an embodiment will be described with reference to FIGS. 1 to 8.

Figure 2:
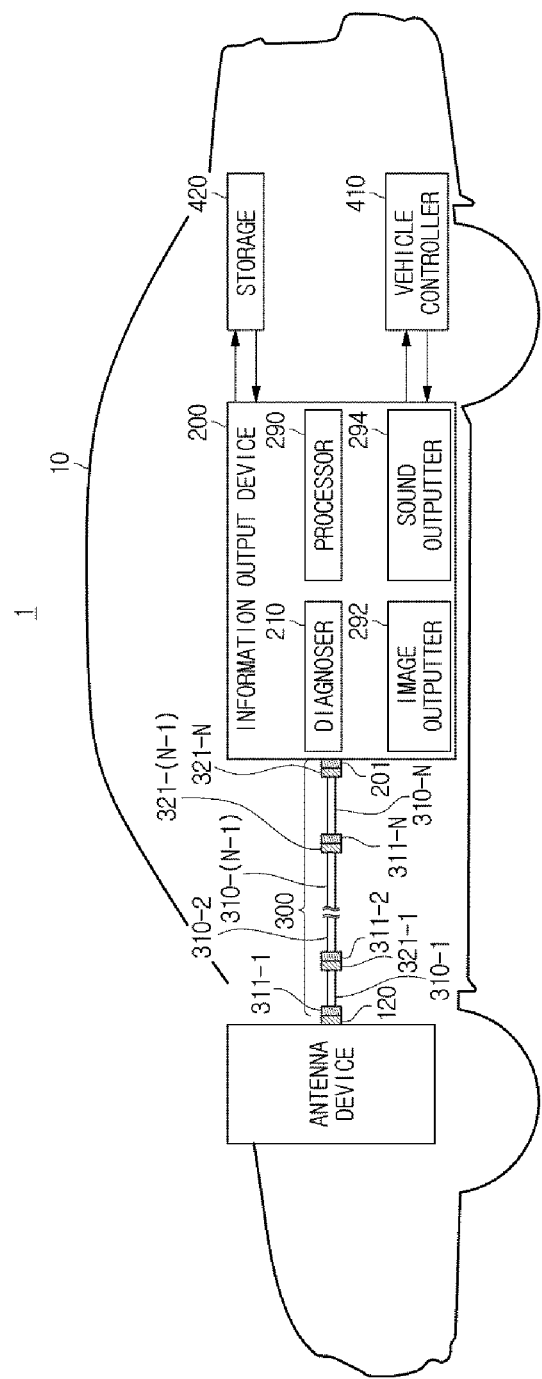
FIG. 2 is a block diagram of the vehicle according to an embodiment.

FIG. 1 is a view illustrating an example of an antenna and a cable installed in a vehicle, and FIG. 2 is a block diagram of the vehicle according to an embodiment. Hereinafter, for convenience of description, a direction normally viewed by a driver while traveling will be defined as a forward direction from a vehicle 10, and a direction opposite the forward direction will be defined as a rearward direction from the vehicle 10. Also, on the basis of a normal indoor space of the vehicle 10, a direction toward a roof 11a will be defined as an upward direction, and a direction opposite the upward direction will be defined as a downward direction. However, such definitions may be arbitrarily changed by a designer.

Referring to FIGS. 1 and 2, the vehicle 10 may include a vehicle body 11 forming an exterior of the vehicle 10 and having an indoor space formed therein, and an antenna connection diagnosis device 1. The antenna connection diagnosis device 1 may include an antenna device 100 installed at a position outside the vehicle body 11, an information output device 200 installed at a position in the indoor space, and a wired connector 300 configured to connect the antenna device 100 to the information output device 200.

The vehicle 10 may include an apparatus that is movable from one point to another point according to a driver's manipulation and/or automatically according to predetermined settings, and may include, for example, a two-wheel vehicle, a three-wheel vehicle, a four-wheel vehicle, construction equipment, and/or a train. The vehicle body 11 is implemented in various shapes according to the type or usage of the vehicle 10 or a designer's aesthetic taste.

The antenna device 100 may receive an electromagnetic wave from an external space, output an electrical signal corresponding to the received electromagnetic wave, and/or generate an electromagnetic wave corresponding to an applied electrical signal, and emit the generated electromagnetic wave to the external space.

The antenna device 100 allows the information output device 200 to communicate with a wireless network. Here, the wireless network may be implemented using wireless communication technologies based on mobile communication standards such as 3rd Generation Partnership Project (3GPP), 3GPP2, and Worldwide Interoperability for Microwave Access (WiMAX). The technologies based on mobile communication standards may include, for example, global system for mobile communication (GSM), enhanced data GSM environment (EDGE), wideband code division multiple access (WCDMA), CDMA, time DMA (TDMA), high speed packet access+ (HSPA+), long term evolution frequency-division duplex (LTE-FDD), LTE time-DD (LTE-TDD), LTE advanced, or wireless broadband (WiBro).

The antenna device 100 may be implemented using at least one type of general antenna capable of being installed in the vehicle 10. The antenna may be, for example, a monopole antenna, a dipole antenna, a loop antenna, a slot antenna, or the like.

According to an embodiment, the antenna device 100 may be exposed outside of the vehicle body 11, built into the vehicle body 11, and/or stored and protrude from an interior of the vehicle body 11. For example, the antenna device 100 may be installed at a position on the roof 11a of the vehicle body 11 and, more specifically, may be installed at a position on the roof 11a adjacent to a rear windshield 11c. Also, the antenna device 100 may be installed at a position on a trunk bonnet 11b or installed at a position on a bonnet 11g. The antenna device 100 may also be installed adjacent to a front windshield 11f. The antenna device 100 may be installed at various other positions that may be considered by a designer.

The antenna device 100 may be formed in a predetermined shape. For example, the antenna device 100 may be designed in a rod shape (may include the shape of a rod whose length may be shortened and extended), a stick shape, or a bar shape. The antenna device 100 may also be designed in a shark fin shape. The antenna device 100 may be designed in various other shapes that may be considered by the designer.

As illustrated in FIGS. 1 and 2, the antenna device 100 may further include the external wired connector 300, for example, an antenna connector (hereinafter, a connection diagnosis antenna connector) 120 to and from which at least one connector 311-1 formed at one end of a first cable 310-1 may be attached and detached. The connection diagnosis antenna connector 120 is implemented such that a diagnoser 210 can diagnose whether at least one connector 311-1 of an external cable 310 (310-1) is coupled to the connection diagnosis antenna connector 120.

An electrical signal acquired by the antenna device 100 may be transmitted to the wired connector 300 via the connection diagnosis antenna connector 120 connected to the antenna device 100 and the at least one connector 311-1, and may be transmitted to the information output device 200 via the wired connector 300.

A structure and an operation of the connection diagnosis antenna connector 120 will be described in detail below.

The wired connector 300 may connect the antenna device 100 and the information output device 200 so that the antenna device 100 and the information output device 200 may communicate with each other.

The wired connector 300 may include a cable. Here, the cable may be, for example, a pair cable, a coaxial cable, an optical fiber cable, an Ethernet cable, or the like.

According to an embodiment, the wired connector 300 may include a single cable.

The wired connector 300 may also include a plurality of cables 310 (310-1, 310-2, . . . , 310-N), as illustrated in FIGS. 1 and 2. The plurality of cables 310-1, 310-2, . . . , 310-N are sequentially connected so that the antenna device 100 and the information output device 200 may be electrically connected to each other. Hereinafter, for convenience of description, a cable disposed closest to the antenna device 100 will be referred to as the first cable 310-1, and a cable disposed closest to the information output device 200 will be referred to as an Nth cable 310-N. Here, N is any natural number greater than or equal to 2. Cables between the first cable 310-1 and the Nth cable 310-N will be referred to as a second cable 310-2, a third cable 310-3 (see FIG. 3), and the like sequentially from the first cable 310-1.

One or more cables 310-1, 310-2, . . . , 310-(N−1) of the plurality of cables 310-1, 310-2, . . . , 310-N may include connection diagnosis connectors 321-1, 321-2, . . . , 321-(N−1) formed at one end thereof. The connection diagnosis connectors 321-1, 321-2, . . . , 321-(N−1) are provided in the one or more cables 310-1, 310-2, . . . , 310-(N−1) for connection diagnosis. A structure of the connection diagnosis connectors 321-1, 321-2, . . . , 321-(N−1) will be described in detail below.

The one or more cables 310-1, 310-2, . . . , 310-(N−1) may include other connectors 311-1, 311-2, . . . , 311-N, which may be coupled to the above-described connection diagnosis connectors 321-1, 321-2, . . . , 321-(N−1), formed at the other end. The other connectors 311-1, 311-2, . . . , 311-N may have a structure or shape corresponding to the connection diagnosis connectors 321-1, 321-2, . . . , 321-(N−1) to be capable of being coupled to the connection diagnosis connectors 321-1, 321-2, . . . , 321-(N−1). For example, the other connectors 311-1, 311-2, . . . , 311-N may be implemented using various terminals that may be applied to the one or more cables 310-1, 310-2, . . . , 310-(N−1) to transmit and receive data between the antenna device 100 and the information output device 200, such as a serial port, a parallel port, a small computer system interface (SCSI) port, a universal serial bus (USB) terminal, a local area network (LAN) wire (such as RJ-45), a radio frequency (RF) terminal, a composite terminal, or a component terminal.

Figure 3:
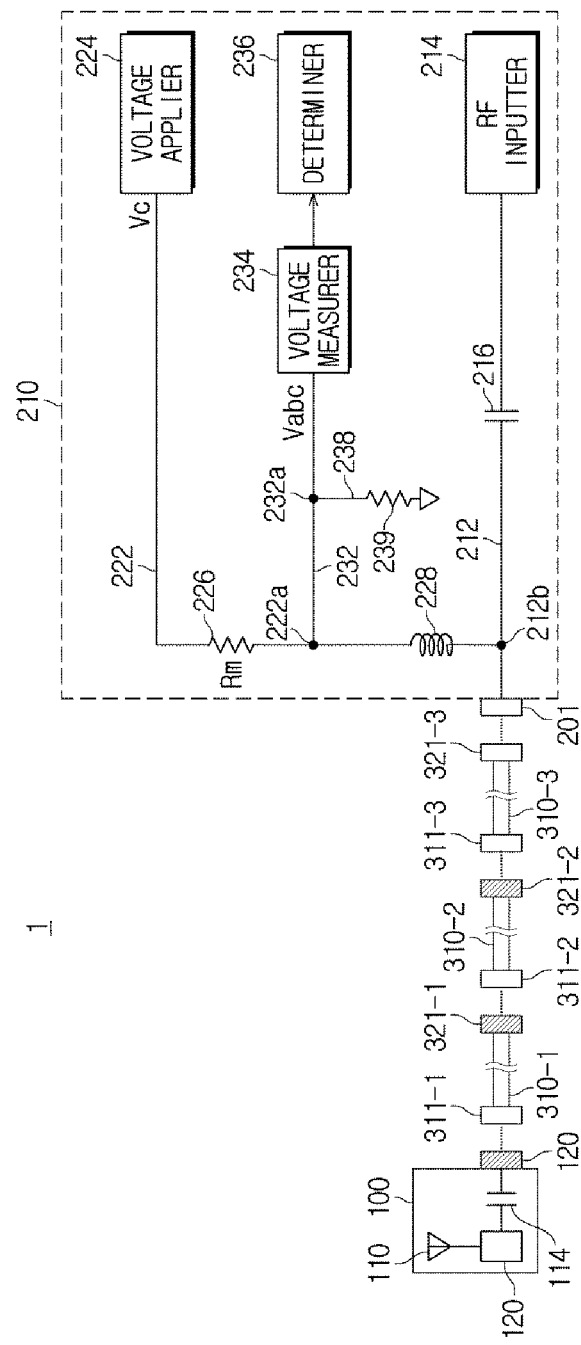
FIG. 3 is a view illustrating an antenna, a cable, and a determiner according to an embodiment.

Specifically, for example, the wired connector 300 may include the first cable 310-1, the second cable 310-2, and the third cable 310-3 (see FIG. 3). Here, the first cable 310-1 may include a connector (hereinafter, a first connector 311-1), which may be connected to the connection diagnosis antenna connector 120 of the antenna device 100, formed at one end thereof and a connection diagnosis connector (hereinafter, a first connection diagnosis connector 321-1), which may be connected to a connector (hereinafter, a second connector 321-2) of the second cable 310-2 and used for connection diagnosis, formed at the other end. Likewise, the second cable 310-2 may include the second connector 321-2, which may be connected to the first connection diagnosis connector 321-1 of the first cable 310-1, formed at one end thereof and a connection diagnosis connector (hereinafter, a second connection diagnosis connector 321-2), which may be connected to a connector (hereinafter, a third connector 311-3) of the third cable 310-3 and used for connection diagnosis, formed at the other end.

Likewise, the Nth cable 310-N may include a connector (hereinafter, an Nth connector 311-N), which may be connected to an (N−1)th connection diagnosis connector 321-(N−1) of an (N−1)th cable 310-(N−1), formed at one end thereof and the other connector 321-N, which may be connected to an information output device connector 201 of the information output device 200, installed at the other end. In this case, according to an embodiment, the other connector 321-N installed at the other end of the Nth cable 310-N may be identically implemented as the above-described connection diagnosis connector or may be identically implemented as the first connector 311-1 or the Nth connector 311-N.

When the connectors 311-1, 311-2, . . . , 311-N of the cables 310-1, 310-2, . . . , 310-N and the information output device connector 201 are properly connected to the corresponding connection diagnosis connectors 321-1, 321-2, . . . , 321-N and the connection diagnosis antenna connector 120, respectively, the antenna device 100 and the information output device 200 are connected to be capable of communicating with each other, and an electrical signal output from the antenna device 100 may be transmitted to the information output device 200. When some of the connectors 311-1, 311-2, . . . , 311-N of the cables 310-1, 310-2, . . . , 310-N and the information output device connector 201 are not properly connected (that is, not connected), the antenna device 100 and the information output device 200 are not connected, and accordingly, an electrical signal output from the antenna device 100 cannot be transmitted to the information output device 200.

When the wired connector 300 includes only one cable, only a general connector may be formed at each of both ends of the cable. In this case, the connector at one end of the cable may be attached to the connection diagnosis antenna connector 120, and the connector at the other end of the cable may be attached to the information output device connector 201.

The wired connector 300 may be attached to an interior and/or exterior of the vehicle body 11 using a predetermined method. For example, as illustrated in FIG. 1, the wired connector 300 may be installed inside the vehicle body 11 by being fixed inside a pillar 11e provided at an upper end of a door 11d and/or the roof 11a connected to the pillar 11e. However, this example is merely illustrative, and the wired connector 300 may be installed in various other ways according to a designer, a user, and/or a mechanic.

The information output device 200 which may visually and/or acoustically provide various pieces of information to a user (a driver and/or a passenger). Examples of the information output device 200 may include a dashboard, a navigation device, a vehicle television system, a car audio system (may include a head unit), and/or a radio device. Examples of the information output device 200 may also include various other devices capable of displaying a screen and/or outputting sound.

The information output device 200 may be installed at a position in an indoor space of the vehicle at which a user may easily manipulate the information output device 200 and/or the information output device 200 may properly provide information to the user. For example, the information output device 200 may be installed at an upper end of a dashboard 11h. In this case, the information output device 200 may be directly installed at the upper end of the dashboard 11h or may be installed apart from the upper end of the dashboard 11h by a separate support. The information output device 200 may also be installed at an upper end or middle of a center fascia, a rear surface of a gearbox, a rear surface of a backrest of a driver's seat or a passenger seat, a rear surface of a headrest, or the like. According to an embodiment, the information output device 200 may be installed so that various pieces of information may be displayed on the front windshield 11f. For example, the information output device 200 may be installed so that light output toward the front windshield 11f by the information output device 200 is reflected by the front windshield 11f and provided to the user.

For example, the information output device 200 may be electrically connected to the antenna device 100 via the wired connector 300, receive information in the form of an electrical signal from the antenna device 100, convert the received information into an outputtable form, and provide the information to the user. The information output device 200 may also transmit information or a command according to a user's manipulation or predetermined settings to the antenna device 100.

According to an embodiment, as illustrated in FIG. 2, the information output device 200 may include the diagnoser 210 configured to diagnose connections between the cables 310-1, 310-2, . . . , 310-N of the wired connector 300, a processor 290 configured to control overall operation of the information output device 200 and process various operations, an image outputter 292 (e.g., a display) configured to output a screen, and a sound outputter 294 (e.g., a microphone).

Using the connection diagnosis connectors 321-1, 321-2, ..., 321-N installed in the respective cables 310-1, 310-2, ..., 310-N, the diagnoser 210 may diagnose whether all of the cables 310-1, 310-2, ..., 310-N are properly connected or whether the cables 310-1 and 310-N, the antenna device 100, and/or the information output device 200 are properly connected to each other. When not all of the cables 310-1, 310-2, ..., 310-N are properly connected, the diagnoser 210 may determine which cables among the cables 310-1, 310-2, ..., 310-N are not connected, whether the antenna device 100 and the cable 310-1 are not connected, and/or whether the information output device 200 and the cable 310-N are not connected.

The diagnoser 210 may be implemented using a predetermined circuit including at least one circuit element for connection diagnosis, and may be implemented using a semiconductor chip as necessary. The predetermined circuit may be a known circuit or a particularly designed circuit.

An operation of the diagnoser 210 will be described in detail below.

The processor 290 may be configured to control the overall operation of the information output device 200. The processor 290 may entirely or partially perform an operation of the diagnoser 210 as necessary. For example, the processor 290 may include a central processing unit (CPU), a micro controller unit (MCU), a microcomputer (MICOM), an application processor (AP), an electronic control unit (ECU), and/or other electronic devices capable of processing various operations and generating a control signal. The devices may be implemented using, for example, one or more semiconductor chips and related components.

The image outputter 292 is configured to visually provide information to the user. The image outputter 292 may be implemented using a predetermined display panel. The display panel may be implemented using, for example, a plasma display panel (PDP), a light emitting diode (LED) display panel, and/or a liquid crystal display (LCD). Here, the LED display panel may include an organic LED (OLED) or the like, and the OLED may include a passive matrix OLED (PMOLED) or an active MOLED (AMOLED). According to an embodiment, a display 190 may include a cathode ray tube (CRT). The display 190 may also include at least one of various other devices capable of displaying a screen.

The sound outputter 294 may provide acoustic information to the user. Specifically, the sound outputter 294 may be implemented using a speaker device capable of outputting sound (may include voice), an earphone device, and/or a headset.

According to an embodiment, the vehicle 10 may further include a vehicle controller 410 and a storage 420.

The vehicle controller 410 is configured to control overall operation of the vehicle 10. The vehicle controller 410 may entirely or partially perform operations of the diagnoser 210 and/or the processor 290. Like the processor 290, the vehicle controller 410 may be implemented using, for example, a CPU, an MCU, a MICOM, an AP, an ECU, and/or other electronic devices.

The storage 420 may store various pieces of information required for operations of the vehicle 10.

According to an embodiment, the storage 420 may store information on a voltage (hereinafter, a comparison voltage) output when particular connection diagnosis connectors 120, 321-1, 321-2, ..., 321-(N-1) are not connected to the corresponding connectors 311-1, 311-2, ..., 311-N. The storage 420 may transmit the information on the comparison voltage to the diagnoser 210, the processor 290, and/or the vehicle controller 410 according to calls from the diagnoser 210, the processor 290, and/or the vehicle controller 410, and the diagnoser 210, the processor 290, and/or the vehicle controller 410 may compare an output voltage Vadc (see FIG. 3) with the comparison voltage and determine whether the wired connector 300 is properly connected to the antenna device 100 and the information output device 200 or whether the particular connection diagnosis connectors 120, 321-1, 321-2, ..., 321-(N-1) are not connected to the corresponding connectors 311-1, 311-2, ..., 311-N.

According to an embodiment, the storage 420 may be built into the information output device 200 or may be provided separate from the information output device 200 at any position inside the vehicle 10.

The storage 420 may be implemented using, for example, magnetic disk storage media such as a hard disk or a floppy disk, a magnetic tape, optical media such as a compact disk (CD) or a digital versatile disk (DVD), magneto-optical media such as a floptical disk, a read-only memory (ROM), a random access memory (RAM), a secure digital (SD) card, and a semiconductor storage device such as a flash memory and a solid state drive (SSD).

Hereinafter, structures and operations of the antenna, the cables, and the determiner according to an embodiment will be described in more detail with reference to FIGS. 3 to 8.

FIG. 3 is a view illustrating the antenna, the cables, and the determiner according to an embodiment.

Referring to FIG. 3, the antenna device 100 may include a signal transceiver 110 configured to emit an electromagnetic wave to the outside and/or receive an electromagnetic wave from the outside to acquire an electrical signal corresponding to an external electromagnetic wave, and a matcher 112 (may be implemented with a circuit having at least one circuit element) electrically connected to the signal transceiver 110 and configured to match impedances. Also, as necessary, the antenna device 100 may further include a DC block 114 configured to prevent a DC frequency while reducing interference of an RF signal provided between the matcher 112 and the connection diagnosis antenna connector 120. Also, as necessary, the antenna device 100 may further include at least one amplifier (not illustrated) disposed between the signal transceiver 110 and the matcher 112. As described above, the antenna device 100 may further include the connection diagnosis antenna connector 120.

For example, the wired connector 300 may include the first cable 310-1, the second cable 310-2, and the third cable 310-3. The first cable 310-1 includes the first connector 311-1, which may be connected to the connection diagnosis antenna connector 120, formed at the one end thereof and the first connection diagnosis connector 321-1 formed at the other end. The second cable 310-2 includes the second connector 311-2, which may be connected to the first connection diagnosis connector 321-1, formed at the one end thereof and the second connection diagnosis connector 321-2 formed at the other end. The third cable 310-3 includes the third connector 311-3, which may be connected to the second connection diagnosis connector 321-2, formed at the one end thereof. The first connector 311-1, the second connector 311-2, and the third connector 311-3 may be connectors implemented using the above-described general terminals. The third cable 310-3 includes a third connector 321-3, which may be connected to the information output device connector 201, formed at the other end. The third connector 321-3 may be a connection diagnosis connector or a connector implemented using the above-described general terminals.

Figure 4:
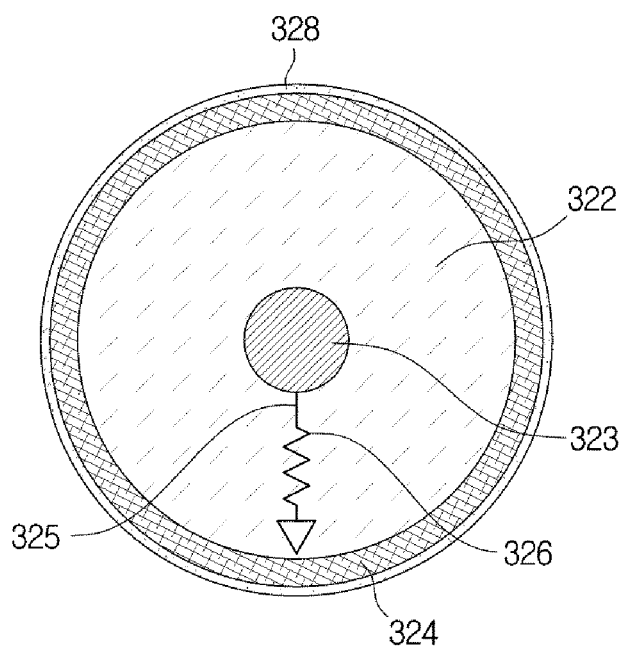
FIG. 4 is a view for describing a connection diagnosis antenna connector and a connection diagnosis connector according to an embodiment.
Figure 5B:
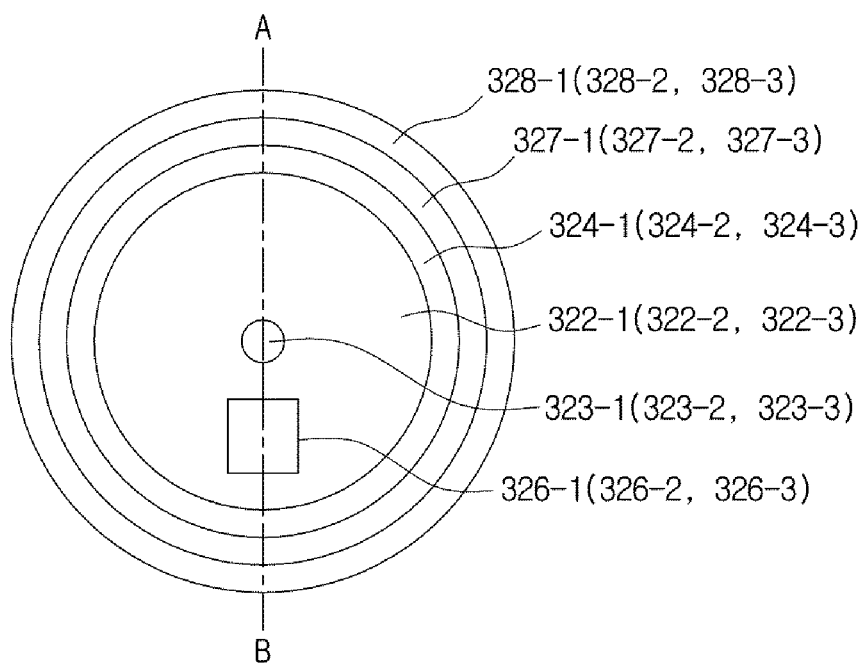
FIG. 5B is a second cross-sectional view of the connection diagnosis antenna connector and the connection diagnosis connector according to an embodiment.
Figure 5C:
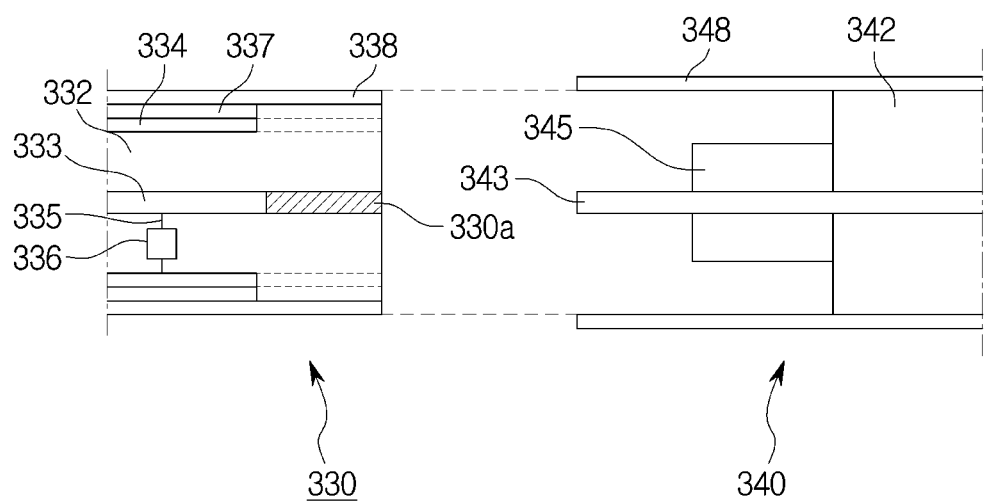
FIG. 5C is a first cross-sectional view of a connection diagnosis antenna connector and a connection diagnosis connector according to another embodiment.

FIG. 4 is a view for describing a connection diagnosis antenna connector and a connection diagnosis connector according to an embodiment. FIG. 5A is a first cross-sectional view of the connection diagnosis antenna connector and the connection diagnosis connector according to an embodiment, and FIG. 5B is a second cross-sectional view of the connection diagnosis antenna connector and the connection diagnosis connector according to an embodiment. FIG. 5B illustrates a cross-section of the connection diagnosis connector taken along plane A-B of FIG. 5A. FIG. 5C is a first cross-sectional view of the connection diagnosis antenna connector and the connection diagnosis connector according to another embodiment.

Referring to FIGS. 4, 5A, and 5B, the connection diagnosis connectors 321, that is, the first connection diagnosis connector 321-1 and the second connection diagnosis connector 321-2, may respectively include signal lines 323 (323-1 and 323-2) to which an electrical signal is transmitted. The first connection diagnosis connector 321-1 and the second connection diagnosis connector 321-2 may respectively include grounds 324 (324-1 and 324-2) formed in the periphery of the signal lines 323-1 and 323-2 and resistors 326 (326-1 and 326-2) provided between the signal lines 323-1 and 323-2 and the grounds 324-1 and 324-2.

Like the first connection diagnosis connector 321-1 and the second connection diagnosis connector 321-2, the connection diagnosis antenna connector 120 may include a signal line 123, a ground 124 formed in the periphery of the signal line 123, and a resistor 126 provided between the signal line 123 and the ground 124, as illustrated in FIGS. 4 and 5A.

The respective signal lines 123, 323-1, and 323-2 of the connection diagnosis antenna connector 120 and the connection diagnosis connectors 321-1 and 321-2 may be implemented using conductors. An electrical signal output from the antenna device 100 is transmitted to the information output device 200 via the signal lines 123, 323-1, and 323-2. Although FIGS. 4 to 5B illustrate an embodiment in which the connection diagnosis antenna connector 120 includes only one signal line 123, the first connection diagnosis connector 321-1 includes only one signal line 323-1, and the second connection diagnosis connector 321-2 includes only one signal line 323-2, the number of signal lines 123, 323-1 and 323-2 is not limited thereto. For example, the connection diagnosis antenna connector 120 may include two or more signal lines 123, the first connection diagnosis connector 321-1 may include two or more signal lines 323-1, and the second connection diagnosis connector 321-2 may include two or more signal lines 323-2.

The grounds 124, 324-1, and 324-2 may be implemented using conductors having an extremely high electric capacity. The grounds 124, 324-1, and 324-2 may be implemented using, for example, cables or sheets. When the grounds 124, 324-1, and 324-2 are implemented using sheets, as illustrated in FIGS. 4 to 5B, the grounds 124, 324-1, and 324-2 may be provided in the connection diagnosis antenna connector 120 and the connection diagnosis connectors 321 in a form spaced apart from and surrounding the signal lines 123, 323-1, and 323-2. More specifically, for example, the grounds 124, 324-1, and 324-2 may have a hollow cylindrical shape, as illustrated in FIGS. 4 and 5B. However, the shape of the grounds 124, 324-1, and 324-2 is not limited thereto. The grounds 124, 324-1, and 324-2 may also be formed in a hollow polygonal container shape (for example, a quadrilateral column shape, a hexagonal column shape, an octagonal column shape, or the like) corresponding to the shape of the connection diagnosis antenna connector 120 and the connection diagnosis connectors 321.

The signal lines 123, 323-1, and 323-2 and the grounds 124, 324-1, and 324-2 may be electrically connected to each other via lead wires or circuits 125 and 325 (325-1 and 325-2). The resistors 126, 326-1, and 326-2 may be installed in the lead wires or circuits 125, 325-1, and 325-2 between the signal lines 123, 323-1, and 323-2 and the grounds 124, 324-1, and 324-2.

The resistors 126, 326-1, and 326-2 are configured to have resistance values that do not affect performance of the antenna device 100. Specifically, when the resistance values are high, the signal lines 123, 323-1, and 323-2 are open to the grounds 124, 324-1, and 324-2, and thus signal loss is relatively small. However, conversely, when the resistance values are low, the signal lines 123, 323-1, and 323-2 are shorted from the grounds 124, 324-1, and 324-2, and signal loss increases. The signal loss increases as a signal frequency is lower. Consequently, to prevent such signal loss, the resistors 126, 326-1, and 326-2 may be configured to have resistance values that are large to a certain extent.

Specifically, for example, the resistors 126, 326-1, and 326-2 may be designed to have resistance values of about 1 kΩ to prevent deterioration of frequency performance. However, this resistance value is merely illustrative, and according to an embodiment, the resistors 126, 326-1, and 326-2 may have resistance values lower than 1 kΩ.

The connection diagnosis antenna connector 120, the first connection diagnosis connectors 321-1 and the second connection diagnosis connector 321-2 may respectively include the antenna resistor 126, the first resistor 326-1, and the second resistor 326-2. In this case, the antenna resistor 126, the first resistor 326-1, and the second resistor 326-2 may be configured to have different resistance values. The resistance values of the antenna resistor 126, the first resistor 326-1, and the second resistor 326-2 may be determined to be various values according to a designer. For example, the antenna resistor 126 may have a resistance value of about 1 kΩ, the first resistor 326-1 may have a resistance value of about 2 kΩ, and the second resistor 326-2 may have a resistance value of about 3 kΩ. The antenna resistor 126, the first resistor 326-1, and the second resistor 326-2 may have various other resistance values according to the choices of the designer.

For example, as illustrated in FIGS. 5A and 5B, the resistors 126, 326-1, and 326-2 may be implemented using a carbon film and/or a metal film. A thickness, a width, or a length of the carbon film or the metal film may be determined by the designer. The resistors 126, 326-1, and 326-2 have specific resistance values (for example, 1 kΩ, 2 kΩ, and 3 kΩ) according to the thickness, the width, or the length of the carbon film or the metal film.

The connection diagnosis antenna connector 120 and the connection diagnosis connectors 321-1 and 321-2 may further include insulators 122 and 322 (322-1 and 322-2) formed between the signal lines 123, 323-1, and 323-2 and the grounds 124, 324-1, and 324-2. The resistors 126, 326-1, and 326-2 may be formed inside the insulators 122, 322-1, and 322-2 and, for example, may be formed by being inserted into the insulators 122, 322-1, and 322-2.

The connection diagnosis antenna connector 120 and the connection diagnosis connectors 321 (321-1 and 321-2) may respectively further include external conductors 127 and 327 (327-1 and 327-2) formed opposite the insulators 122 and 322 (322-1 and 322-2) with the grounds 124, 324-1, and 324-2 being disposed therebetween. In other words, the external conductors 127, 327-1, and 327-2 may be installed outward from the grounds 124, 324-1, and 324-2.

The connection diagnosis antenna connector 120 and the connection diagnosis connectors 321 (321-1 and 321-2) may respectively further include external housings 128 and 328 (328-1 and 328-2) installed at outer surfaces of the external conductors 127, 327-1, and 327-2. In other words, the external housings 128 and 328 (328-1 and 328-2) may be installed at outermost sides of the connection diagnosis antenna connector 120 and the connection diagnosis connectors 321 (321-1 and 321-2). External housings 128, 328-1, 328-2, and 328-3 may have a structure or shape that allows the connection diagnosis antenna connector 120 or the connection diagnosis connectors 321 to be coupled to the other connectors 311-1, 311-2, and 311-3.

More specifically, for example, one end and the periphery thereof of each of the signal line 123 and the signal lines 323-1 and 323-2 of the connection diagnosis connectors 321-1 and 321-2 may protrude outward, as illustrated in FIG. 5A. In this case, supports 129, 329-1, and 329-2 may be additionally installed to respectively protect and support the outwardly-protruding signal lines 123, 323-1, and 323-2. The supports 129, 329-1, and 329-2 may be omitted. The external housings 128, 328-1, and 328-2 of the connection diagnosis antenna connector 120, the first connection diagnosis connector 321-1, and the second connection diagnosis connector 321-2 may extend further than protruding portions of the signal lines 123, 323-1, and 323-2 and may be configured such that an insertion space is formed therein.

The external housings 318-1, 318-2, and 318-3 and/or insulators 312-1, 312-2, and 312-3 of the other connectors 311-1, 311-2, and 311-3 may be inserted into the insertion spaces. In this case, inner surfaces of the external housings 128, 328-1, and 328-2 of the connection diagnosis antenna connector 120, the first connection diagnosis connector 321-1, and the second connection diagnosis connector 321-2 and outer surfaces of the external housings 318-1, 318-2, and 318-3 of the other connectors 311-1, 311-2, and 311-3 may come into contact with each other, and due to frictional forces therebetween, the connection diagnosis antenna connector 120, the first connection diagnosis connector 321-1, and the second connection diagnosis connector 321-2 may be connected to the other connectors 311-1, 311-2, and 311-3.

When the other connectors 311-1, 311-2, and 311-3 are inserted into the insertion space and attached to the connection diagnosis antenna connector 120, the first connection diagnosis connector 321-1, and the second connection diagnosis connector 321-2, the protruding portions of the signal lines 123, 323-1, and 323-2 may be inserted into insertion holes 314-1, 314-2, and 314-3 of the other connectors, e.g., the first connector 311-1, the second connector 311-2, and the third connector 311-3. Accordingly, the signal lines 123, 323-1, and 323-2 of the connection diagnosis antenna connector 120 and the connection diagnosis connectors 321-1 and 321-2 may be electrically connected to signal lines 313-1, 313-2, and 313-3 of the first connector 311-1, the second connector 311-2, and the third connector 311-3. The protruding portions of the signal lines 123, 323-1, and 323-2 may also be inserted into an insertion hole (not illustrated) formed in the information output device connector 201.

As another example, as illustrated in FIG. 5C, a signal line 333 of a connection diagnosis connector 330 may be recessed inside an insulator 332 so as not to protrude therefrom. In this case, an insertion groove 330a into which a protruding signal line 343 of another connector 340 may be inserted is formed in a portion of the insulator 332 exposed to the outside or is covered by another component, and the signal line 333 is provided inside the insertion groove 330a.

A lead wire or circuit 325 configured to connect the signal line 333 to a ground 334 and a resistor 336 formed in the lead wire or circuit 325 may be additionally installed in the insulator 332. Like the above description, the ground 334 and an external conductor 337 may be sequentially installed at an outer side of the insulator 332. According to an embodiment, the ground 334 and the external conductor 337 may pass through the insulator 332 and be exposed to the outside or may be sealed by the insulator 332 and not exposed to the outside.

An external housing 338 is configured to have the signal line 333, the insulator 332, the ground 334, and the external conductor 337 built therein. In this case, an insertion space is not formed in the external housing 338.

Conversely, the other connector 340 may include the signal line 343 exposed to the outside, a support 345 (may be omitted) configured to support the signal line, an insulator 342 configured such that the signal line 343 is provided to pass therethrough, and an external housing 348 extending in a direction in which the signal line 343 is exposed. The external housing 348 may include an insertion space, into which the connection diagnosis connector 330 may be inserted, formed therein.

Similar to the above description, when the connection diagnosis connector 330 is inserted into the insertion space, a protruding portion of the signal line 343 of the other connector 340 may be inserted into the insertion groove 330a, and accordingly, the signal line 333 of the connection diagnosis connector 330 may be electrically connected to the signal line 343 of the other connector 340.

The connection diagnosis connector 330 illustrated in FIG. 5C may be applied to at least one of the connection diagnosis antenna connector 120, the first connection diagnosis connector 321-1, and the second connection diagnosis connector 321-2.

Referring to FIG. 3, the diagnoser 210 may include the information output device connector 201 coupled to the third connector 321-3, a first diagnoser signal line 212 (may include a circuit or lead wire) extending from the information output device connector 201, and an RF inputter 214 formed in the first diagnoser signal line 212 and configured to receive a signal transmitted from the antenna device 100. The signal input via the RF inputter 214 is visually and/or acoustically output by the image outputter 292 and/or the sound outputter 294 according to processing by the processor 290. In this case, the DC block 114 may be additionally installed in the first diagnoser signal line 212 configured to connect the information output device connector 201 and the RF inputter 214. The RF inputter 214 may include, for example, a pin of a semiconductor chip that operates with the processor 290.

A second diagnoser signal liner 222 may be branched from a position 212b of the first diagnoser signal line 212 configured to connect the information output device connector 201 and the RF inputter 214, and a voltage applier 224 may be connected to the branched second diagnoser signal line 222. The voltage applier 224 applies a control voltage Vc to the branched second diagnoser signal line 222. An operation of applying the control voltage Vc by the voltage applier 224 may be, for example, performed according to a control signal from the processor 290 or the vehicle controller 410. The operation of applying the control voltage Vc by the voltage applier 224 may also be performed according to a manipulation of a designer, a user, or a mechanic.

At least one resistor 226 and at least one inductor 228 may be installed in the second diagnoser signal line 222. The at least one resistor 226 and the at least one inductor 228 may be installed between the position 212b and the voltage applier 224. In this case, the at least one resistor 226 and the at least one inductor 228 may be installed in series. Here, the inductor 228 may include a choke configured to block high frequency AC progressing in the circuit.

A third diagnoser signal line 232 may be branched from a point 222a between the resistor 226 and the inductor 228, and the branched third diagnoser signal line 232 may be electrically connected to a voltage measurer 234 and a determiner 236. A fourth diagnoser signal line 238 connected to a signal ground may be branched from a point 323a in the third diagnoser signal line 232 and installed thereon. A predetermined resistor 239 may be additionally installed on the fourth diagnoser signal line 238.

The voltage measurer 234 may measure the voltage Vadc (hereinafter, a measured voltage) applied to the third diagnoser signal line 232. The voltage measurer 234 may be implemented using a predetermined voltmeter or a circuit which may perform an operation of a voltmeter. According to an embodiment, an analog-digital converter may be additionally installed between the voltage measurer 234 and the point 323a.

The determiner 236 compares the measured voltage Vadc acquired by the voltage measurer 234 with the comparison voltage and diagnoses connections between the antenna device 100, the wired connector 300, and the information output device 200 on the basis of a result of the comparison.

In a case in which the antenna device 100 and the information output device 200 are connected via the three cables 310-1, 310-2, and 310-3, as illustrated in FIG. 3, and the antenna device 100, the first cable 310-1, and the second cable 310-2 respectively include the connection diagnosis antenna connector 120, the first connection diagnosis connector 321-1, and the second connection diagnosis connector 321-2, because the respective signal lines 123, 323-1, and 323-2 of the connection diagnosis antenna connector 120, the first connection diagnosis connector 321-1, and the second connection diagnosis connector 321-2 are electrically connected to the grounds 124, 324-1, and 324-2 via the resistors 126, 326-1, and 326-2, a measured voltage Vadc different from that in a case in which the connection diagnosis antenna connector 120, the first connection diagnosis connector 321-1, and the second connection diagnosis connector 321-2 are properly connected to the corresponding connectors 311-1, 311-2, and 311-3 is applied to the third diagnoser signal line 232 when at least one of the connection diagnosis antenna connector 120, the first connection diagnosis connector 321-1, and the second connection diagnosis connector 321-2 is not connected to the corresponding connector 311-1, 311-2, or 311-3. A measured voltage Vadc having a different magnitude may be applied to the third diagnoser signal line 232 according to a position at which a non-connection occurs in the third diagnoser signal line 232. In other words, a voltage applied when the connection diagnosis antenna connector 120 and the first connector 311-1 are not connected, a voltage applied when the first connection diagnosis connector 321-1 and the second connector 311-2 are not connected, and a voltage applied when the second connection diagnosis connector 321-2 and the third connector 311-3 are not connected are different from each other.

When the antenna device 100, all of the cables 310-1, 310-2, and 310-3, and the information output device 200 are properly connected, and a connection failure has not occurred therebetween (in other words, when the connection diagnosis antenna connector 120 and the first connector 311-1 are connected to each other, the first connection diagnosis connector 321-1 and the second connector 311-2 are connected to each other, and the second connection diagnosis connector 321-2 and the third connector 311-3 are connected to each other), a relationship between the measured voltage Vadc and the applied control voltage Vc may be given by Equation 1 below.

$$V_{adc} = \frac{R_1 \| R_2 \| R_3}{R_1 \| R_2 \| R_3 + R_m} V_c \quad \text{[Equation 1]}$$

Here, R1 is a resistance value of the second resistor 326-2, R2 is a resistance value of the first resistor 326-1, and R3 is a resistance value of the antenna resistor 126. Rm is a resistance value of the resistor 226 provided in the second diagnoser signal line 222. Because all of the connection diagnosis antenna connector 120, the first connection diagnosis connector 321-1, and the second connection diagnosis connector 321-2 are electrically connected to the diagnoser 210, the voltage Vadc according to Equation 1 is measured in the third diagnoser signal line 232 according to the resistors 126, 326-1, and 326-2. In other words, a measured voltage Vadc corresponding to the antenna resistor 126, the first resistor 326-1, and the second resistor 326-2 may be measured. In this case, the measured voltage Vadc, which is measured as shown in Equation 1, may vary according to the control voltage Vc.

Figure 6:
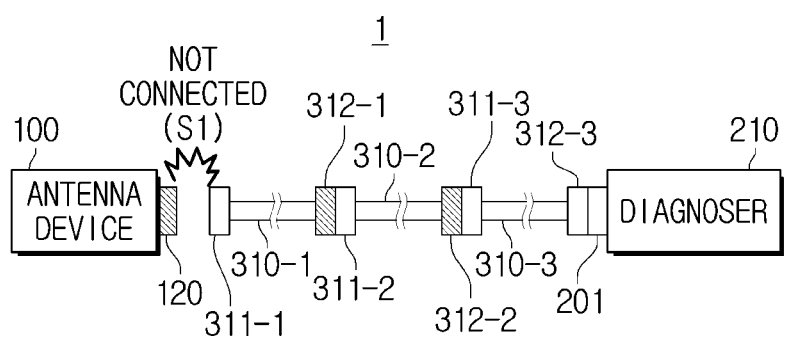
FIG. 6 is a view for describing a state in which an antenna and a first cable are not connected.

FIG. 6 is a view for describing a state in which an antenna and a first cable are not connected.

For example, when the antenna device 100 and the first cable 310-1 are not connected to each other (S1, that is, when the connection diagnosis antenna connector 120 and the first connector 311-1 are not connected to each other), as illustrated in FIG. 6, the relationship between the measured voltage Vadc and the applied control voltage Vc may be given by Equation 2 below.

$$V_{adc} = \frac{R_1 \| R_2}{R_1 \| R_2 + R_m} V_c \quad \text{[Equation 2]}$$

Although the first connection diagnosis connector 321-1 and the second connection diagnosis connector 321-2 are electrically connected to the diagnoser 210, because a non-connection is present in the connection diagnosis antenna connector 120, a measured voltage Vadc different from that in a case in which all of the connection diagnosis antenna connector 120, the first connection diagnosis connector 321-1, and the second connection diagnosis connector 321-2 are connected to the diagnoser 210 is applied to the third diagnoser signal line 232 due to the resistors 326-1 and 326-2 respectively provided in the first connection diagnosis connector 321-1 and the second connection diagnosis connector 321-2. Specifically, as shown in Equation 2 above, a measured voltage Vadc corresponding to the first resistor 326-1 and the second resistor 326-2 is measured.

Figure 7:
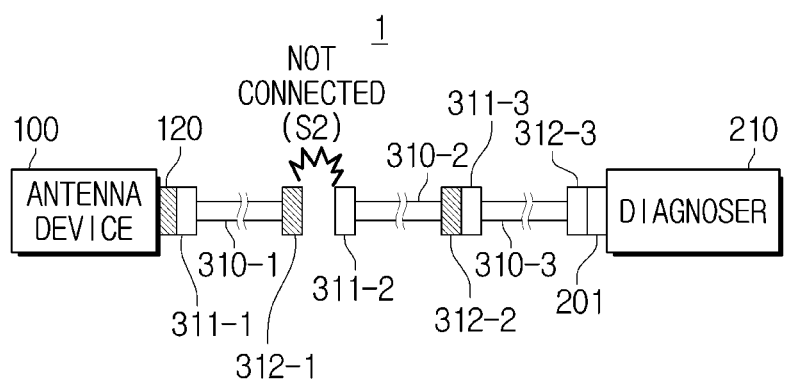
FIG. 7 is a view for describing a state in which the first cable and a second cable are not connected.

FIG. 7 is a view for describing a state in which the first cable and a second cable are not connected.

As another example, when the first cable 310-1 and the second cable 310-2 are not connected to each other (S2, that is, when the first connection diagnosis connector 321-1 and the second connector 311-2 are not connected to each other), as illustrated in FIG. 7, the relationship between the measured voltage Vadc and the control voltage Vc may be given by Equation 3 below.

$$V_{adc} = \frac{R_1}{R_1 + R_m} V_c$$

Although the second connection diagnosis connector 321-2 is electrically connected to the diagnoser 210, the connection diagnosis antenna connector 120 and the first connection diagnosis connector 321-1 are electrically shorted from the diagnoser 210 due to a connection failure (that is, non-connection) between the first connection diagnosis connector 321-1 and the second connector 311-2. Consequently, because only the resistor 326-2 of the second connection diagnosis connector 321-2 is affected by the diagnoser 210, a measured voltage Vadc different from that in a case in which all of the connection diagnosis antenna connector 120, the first connection diagnosis connector 321-1, and the second connection diagnosis connector 321-2 are connected to the diagnoser 210 or a case in which the antenna device 100 and the first cable 310-1 are not connected to each other is applied to the third diagnoser signal line 232. Specifically, as shown in Equation 3 below, a measured voltage Vadc corresponding to the second resistor 326-2 is measured according to the applied control voltage Vc.

Figure 8:
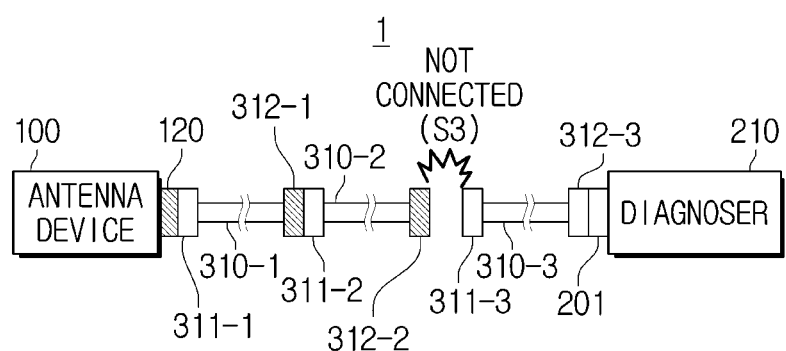
FIG. 8 is a view for describing a state in which the second cable and a third cable are not connected.

FIG. 8 is a view for describing a state in which the second cable and a third cable are not connected.

For example, when the second cable 310-2 and the third cable 310-3 are not connected to each other (S3, that is, when the second connection diagnosis connector 321-2 and the third connector 311-3 are not connected to each other), as illustrated in FIG. 8, the relationship between the measured voltage Vadc and the applied control voltage Vc may be expressed by Equation 4 below.

$$V_{adc} = V_c \qquad \text{[Equation 4]}$$

In this case, because the second connection diagnosis connector 321-2 and the third connector 311-3 are not electrically connected, none of the connection diagnosis antenna connector 120, the first connection diagnosis connector 321-1, and the second connection diagnosis connector 321-2 can be electrically connected to the diagnoser 210. Accordingly, a voltage equal to the control voltage Vc, as shown in Equation 4, is applied to the third diagnoser signal line 232.

Consequently, on the basis of the measured voltage Vadc, the determiner 236 may recognize a position at which a non-connection occurs. Specifically, for example, when a measured voltage Vadc similar or identical to the operation result of Equation 1 is measured in response to the application of the predetermined control voltage Vc, the determiner 236 may determine that a non-connection (that is, a connection failure) does not occur throughout an entire section. Also, when the measured voltage Vadc corresponding to the operation result of Equation 2 is measured according to the applied control voltage Vc, the determiner 236 may determine that a non-connection occurs between the antenna device 100 and the first cable 310-1, and when the measured voltage Vadc corresponding to the operation result of Equation 3 is measured, the determiner 236 may determine that a non-connection occurs between the first cable 310-1 and the second cable 310-2. Furthermore, when the measured voltage Vadc corresponding to the operation result of Equation 4 is measured according the applied control voltage Vc, the determiner 236 may determine that a non-connection occurs between the second cable 310-2 and the third cable 310-3.

According to an embodiment, the determiner 236 may compare a comparison voltage predetermined on the basis of the operation results of Equation 1 to Equation 4 with a measured voltage to determine whether a non-connection occurs, and/or perform operations of Equation 1 to Equation 4 on the basis of the control voltage Vc and the given resistors 126, 326-1, and 326-2 and compare the operation results with the measured voltage Vadc to determine whether a non-connection occurs.

The determiner 236 may transmit a determination result (according to an embodiment, may include the measured voltage) to the storage 420 to allow the storage 420 to store the result of determination. Also, the determiner 236 may transmit the determination result to the image outputter 292 and/or the sound outputter 294 to allow the image outputter 292 and/or the sound outputter 294 to visually and/or acoustically provide information corresponding to the determination result of to a designer, a user, and/or a mechanic. For example, when a non-connection is detected as a diagnosis result, the determiner 236 may transmit the diagnosis result to the sound outputter 294, and the sound outputter 294 may output an alarm sound corresponding to a position at which the non-connection is detected in response to the received diagnosis result. The determination result may also be transmitted to the processor 290 and/or the vehicle controller 410. In response to the received determination result, the processor 290 and/or the vehicle controller 410 may generate a corresponding control signal and then control each component, e.g., the information output device 200, in the vehicle 10 on the basis of the generated control signal.

Hereinafter, an antenna connection diagnosis method according to an embodiment will be described with reference to FIG. 9.

Figure 9:
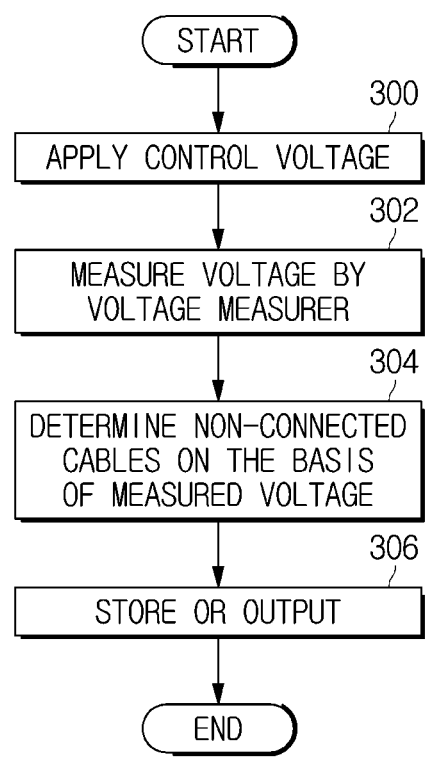
FIG. 9 is a flowchart of an antenna connection diagnosis method according to an embodiment.

FIG. 9 is a flowchart of an antenna connection diagnosis method according to an embodiment.

The antenna connection diagnosis method of FIG. 9 may be performed by the above-described antenna connection diagnosis device 1. As described above, the antenna connection diagnosis device 1 may include the antenna device 100, the information output device 200, and the wired connector 300, the antenna device 100 may include the connection diagnosis antenna connector 120, and the wired connector 300 may include at least one cable 310 (310-1, 310-2, 310-3, . . . , 310-N). One or more of the cables 310-1, 310-2, 310-3, . . . , 310-N may include the connection diagnosis connectors 321-1, 321-2, . . . , 321-(N−1) including resistors 326 (326-1, 326-2, and the like) different from each other. The information output device 200 may include the voltage applier 224 configured to apply the control voltage Vc, the voltage measurer 234 configured to acquire information on the measured voltage Vadc, and the determiner 236 configured to determine whether a non-connection occurs using the measured voltage Vadc.

Referring to FIG. 9, to determine whether a non-connection occurs, first, the control voltage Vc is applied from the voltage applier 224 to the second diagnoser signal line 222 (300).

Next, the voltage measurer 234 measures the measured voltage Vadc of the third diagnoser signal line 232 branched from the second diagnoser signal line 222 (302).

When the measured voltage Vadc is measured, the determiner 236 may determine, on the basis of the measurement, whether the antenna device 100, the cables 310-1, 310-2, 310-3, . . . , 310-N, and the information output device 200 are properly connected or whether a non-connected part is present between them.

Specifically, the determiner 236 may determine that the connection diagnosis connector 321-(N−1) adjacent to the information output device 200 is not connected when the measured voltage Vadc and the control voltage Vc are equal. In other words, the determiner 236 may determine that cables corresponding to the connection diagnosis connector 321-(N−1), such as the (N−1)th cable and the Nth cable, are not connected to the connection diagnosis connector 321-(N−1).

When the measured voltage Vadc corresponding to the second resistor 326-2 is measured, the determiner 236 may determine that the second connector 311-2 of a cable, e.g., the second cable 310-2, in which the connection diagnosis connector 321-2 including the second resistor 326-2 is installed, is not connected to the connection diagnosis connector 321-1 of another cable, e.g., the first cable 310-1. That is, the determiner 236 may determine that there is a problem in the connection between the first cable 310-1 and the second cable 310-2.

When the measured voltage Vadc corresponding to the first resistor 326-1 and the second resistor 326-2 is measured, the determiner 236 may determine that the first connector 311-1 of a cable, e.g., the first cable 310-1, in which the connection diagnosis connector 321-1 including the first resistor 326-1 is installed, is not connected to another cable or the connection diagnosis antenna connector 120 of the antenna device 100. In other words, the determiner 236 may determine that the first cable 310-1 and the antenna device 100 are not connected to each other.

When the measured voltage Vadc corresponding to the antenna resistor 126, the first resistor 326-1, and the second resistor 326-2 is measured, the determiner 236 may determine that the antenna device 100, and the first cable 310-1 to the Nth cable 310-N are connected to each other.

The determination result may be transmitted to the storage 420 and stored in the storage 420 or may be output to the outside by the image outputter 292 and/or the sound outputter 294.

The antenna connection diagnosis method according to the above-described embodiment may be implemented in the form of a program that may be executed by a computer device. Here, the program may include one or a combination of a program command, a data file, a data structure, and the like. The program may be designed and produced using a machine language code or a high-level language code. The program may be particularly designed to implement the above-described antenna connection diagnosis method, or may be implemented using various functions or definitions that are known to and usable by one of ordinary skill in the computer software field.

The program for implementing the above-described antenna connection diagnosis method may be recorded in computer-readable recording media. The computer-readable recording media may include various types of hardware devices including magnetic disk storage media such as a hard disk or a floppy disk, a magnetic tape, optical media such as a CD or a DVD, magneto-optical media such as a floptical disk, a ROM, a RAM, and a semiconductor storage device such as a flash memory, which are capable of storing a particular program that is run according to a call from a computer or the like.

As should be apparent from the above description, according to the above-described connection cable, antenna connection diagnosis device, vehicle including the same, and antenna connection diagnosis method, connection states of a plurality of cables can be easily and promptly diagnosed.

According to the above-described connection cable, antenna connection diagnosis device, vehicle including the same, and antenna connection diagnosis method, whether certain cables of the plurality of cables are not connected to each other can be determined.

According to the above-described connection cable, antenna connection diagnosis device, vehicle including the same, and antenna connection diagnosis method, because it is not necessary to provide a circuit (a connection diagnosis circuit) configured to diagnose whether a cable is connected in a device (for example, an antenna device) connected to the cable, a manufacturing cost can be reduced, a degree of design freedom can be enhanced, and complexity of the device can be reduced.

According to the above-described connection cable, antenna connection diagnosis device, vehicle including the same, and antenna connection diagnosis method, even for a device without a connection diagnosis circuit, connection states of a plurality of cables connected to the device can be diagnosed, and non-connected cables among the plurality of cables can be determined.

Although the connection cable, the antenna connection diagnosis device, the vehicle including the same, and the antenna connection diagnosis method according to various embodiments have been described above, the connection cable, the antenna connection diagnosis device, the vehicle including the same, and the antenna connection diagnosis method are not limited to the above-described embodiments. Various devices or methods that may be implemented by one of ordinary skill in the art by making modifications and changes to the above-described embodiments may also be examples of the above-described device and method. For example, embodiments of the above-described connection cable, antenna connection diagnosis device, vehicle including the same, and antenna connection diagnosis method may include an embodiment in which the above-described steps are performed in a different order from that described above, and/or the above-described elements such as systems, structures, devices, and circuits are coupled or combined in a form different from that described above or replaced or substituted by other elements or their equivalents.

What is claimed is:

1. A device comprising:
a first cable having a first connector installed at one end thereof and a first connection diagnosis connector installed at an opposite end;
a second cable having a second connector formed at one end thereof, the second connector being capable of being coupled to the first connection diagnosis connector; and
a diagnoser configured to use the first connection diagnosis connector to diagnose whether the first cable and the second cable are connected;
wherein the first connection diagnosis connector comprises:
a first signal line to which an electrical signal is to be transmitted;
a first ground spaced apart from the first signal line; and
a first resistor formed between the first signal line and the first ground.

2. The device of claim 1, wherein the first resistor comprises a carbon film or a metal film.

3. The device of claim 1, wherein the second cable has a second connection diagnosis connector installed and opposite the second connector, the second connection diagnosis connector comprising:
- a second signal line to which the electrical signal is to be transmitted;
- a second ground spaced apart from the second signal line; and
- a second resistor formed between the second signal line and the second ground, the second resistor being different than the first resistor.

4. The device of claim 3, wherein the diagnoser comprises:
- a first diagnoser signal line, wherein the electrical signal to be transmitted from the first cable and the second cable is also to be transmitted to the first diagnoser signal line;
- a voltage source connected to a second diagnoser signal line branched from the first diagnoser signal line, the voltage source configured to apply a control voltage to a third diagnoser signal line that is branched from the second diagnoser signal line;
- a voltage measurement element installed in the third diagnoser signal line and configured to measure a voltage of the third diagnoser signal line in response to the application of the control voltage; and
- a determination module configured to determine whether the first cable and the second cable are not connected on the basis of the measured voltage.

5. The device of claim 4, further comprising a third cable having a third connector which is capable of being coupled to the second connection diagnosis connector.

6. The device of claim 5, wherein the determination module is configured to determine that the second cable and the third cable are not connected when a voltage equal to the control voltage is measured by the voltage measurement element and to determine that the first cable and the second cable are not connected when a voltage corresponding to the second resistor is measured by the voltage measurement element.

7. The device of claim 3, further comprising an antenna including a connection diagnosis antenna connector capable of being coupled to the first connector.

8. The device of claim 7, further comprising:
- a voltage measurement element installed in the connection diagnosis antenna and configured to measure a voltage of a third diagnoser signal line in response to application of a control voltage; and
- a determination module configured to determine that the antenna and the first cable are not connected to each other when a voltage corresponding to the first resistor and the second resistor is measured by the voltage measurement element.

9. The device of claim 8, wherein the connection diagnosis antenna connector comprises:
- an antenna signal line to which the electrical signal is to be transmitted;
- an antenna ground spaced apart from the antenna signal line; and
- an antenna resistor formed between the antenna signal line and the antenna ground, the antenna resistor being different from the first resistor and the second resistor, wherein the determination module is configured to determine that the antenna, the first cable, and the second cable are connected to each other when a voltage corresponding to the first resistor or a third resistor is measured by the voltage measurement element.

10. The device of claim 3, wherein the first resistor or the second resistor has a resistance value that is predetermined to prevent deterioration of frequency performance.

11. A vehicle comprising:
- a vehicle body;
- an antenna connected to the vehicle body; and
- the device of claim 1, wherein the first connector is connected to the antenna and the second connector is coupled to the first connection diagnosis connector.

12. An antenna connection diagnosis method comprising:
- applying a control voltage to a second diagnoser signal line branched from a first diagnoser signal line, wherein the first diagnoser signal line is electrically connected to a first cable having a first connector installed at one end thereof and a first connection diagnosis connector installed at opposite end and a second cable having a second connector, which is coupled to the first connection diagnosis connector;
- measuring a voltage of a third diagnoser signal line branched from the second diagnoser signal line in response to the application of the control voltage; and
- determining whether the first cable and the second cable are not connected based on the measured voltage.

13. The method of claim 12, wherein the first connection diagnosis connector comprises:
- a first signal line to which an electrical signal is transmitted;
- a first ground spaced apart from the first signal line; and
- a first resistor formed between the first signal line and the first ground.

14. The method of claim 13, wherein the second connector of the second cable is connected at one end and wherein the second cable has a second connection diagnosis connector installed at an opposite end, the second connection diagnosis connector comprising:
- a second signal line to which the electrical signal is transmitted;
- a second ground spaced apart from the second signal line; and
- a second resistor, which is different from the first resistor, formed between the second signal line and the second ground.

15. The method of claim 14, wherein the second connection diagnosis connector is coupled to a third connector of a third cable.

16. The method of claim 15, wherein determining whether the first cable and the second cable are not connected comprises:
- determining that the second cable and the third cable are not connected when a voltage equal to the control voltage is measured; or
- determining that the first cable and the second cable are not connected when a voltage corresponding to the second resistor is measured.

17. The method of claim 14, wherein the first connector is connected to a connection diagnosis antenna connector of an antenna.

18. The method of claim 17, wherein determining whether the first cable and the second cable are not connected comprises determining that the antenna and the first cable are not connected to each other when a voltage corresponding to the first resistor and the second resistor is measured.

19. The method of claim 17, wherein the connection diagnosis antenna connector comprises:

an antenna signal line to which the electrical signal is transmitted;

an antenna ground spaced apart from the antenna signal line; and an antenna resistor, which is different from the first resistor and the second resistor, formed between the antenna signal line and the antenna ground;

wherein determining whether the first cable and the second cable are not connected comprises determining that the antenna, the first cable, and the second cable are connected to each other when a voltage corresponding to the first resistor or a third resistor is measured.

20. An antenna connection cable comprising:

a first cable having a first connection diagnosis connector installed at one end thereof; and a second cable having a first connector formed at one end thereof and a second connection diagnosis connector installed at the other end, the first connector coupled to the first connection diagnosis connector;

wherein the first connection diagnosis connector comprises:

a first signal line to which an electrical signal is to be transmitted;

a first ground spaced apart from the first signal line; and a first resistor formed between the first signal line and the first ground; and wherein the second connection diagnosis connector comprises:

a second signal line to which the electrical signal is to be transmitted;

a second ground spaced apart from the second signal line; and a second resistor, which is different from the first resistor, formed between the second signal line and the second ground.

\* \* \* \* \*